United States Patent
Maayan et al.

(10) Patent No.: US 7,489,562 B2
(45) Date of Patent: Feb. 10, 2009

(54) MULTIPLE USE MEMORY CHIP

(75) Inventors: Eduardo Maayan, Kfar Saba (IL); Boaz Eitan, Hofit (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 11/979,184

(22) Filed: Oct. 31, 2007

(65) Prior Publication Data

US 2008/0123413 A1 May 29, 2008

Related U.S. Application Data

(63) Continuation of application No. 11/246,193, filed on Oct. 11, 2005, which is a continuation of application No. 11/024,750, filed on Dec. 30, 2004, now Pat. No. 6,954,382, which is a continuation of application No. 10/191,451, filed on Jul. 10, 2002, now Pat. No. 6,917,544.

(51) Int. Cl.
*G11C 16/04* (2006.01)

(52) U.S. Cl. .................. 365/185.33; 365/63

(58) Field of Classification Search ............ 365/188.33, 365/63
See application file for complete search history.

(56) References Cited

U.S. PATENT DOCUMENTS

| 5,802,268 | A | 9/1998 | Fisher et al. |
| 6,074,916 | A | 6/2000 | Cappelletti |
| 6,131,139 | A * | 10/2000 | Kikuchi et al. ............... 711/103 |
| 6,252,799 | B1 | 6/2001 | Liu et al. |
| 6,326,265 | B1 | 12/2001 | Liu et al. |
| 6,347,056 | B1 | 2/2002 | Ledford et al. |
| 6,392,950 | B2 | 5/2002 | Ayukawa et al. |
| 6,411,561 | B2 | 6/2002 | Ayukawa et al. |
| 6,587,393 | B2 | 7/2003 | Ayukawa et al. |
| 6,760,865 | B2 | 7/2004 | Ledford et al. |
| 7,158,411 | B2 * | 1/2007 | Yeh et al. ................ 365/185.18 |
| 7,369,438 | B2 * | 5/2008 | Lee ........................ 365/185.17 |

* cited by examiner

*Primary Examiner*—Tuan T. Nguyen
(74) *Attorney, Agent, or Firm*—EMPK & Shiloh, LLP

(57) ABSTRACT

A die for a memory array may store Flash and EEPROM bits in at least one Nitride Read Only Memory (NROM) array. Each array may store Flash, EEPROM or both types of bits.

22 Claims, 10 Drawing Sheets

MULTIPLE USE MEMORY CHIP

CROSS-REFERENCE TO RELATED APPLICATIONS

This application is a continuation application of U.S. patent application Ser. No. 11/246,193, filed Oct. 11, 2005 which is a continuation application of U.S. patent application Ser. No. 11/024,750, filed Dec. 30, 2004 now U.S. Pat. No. 6,954,382 which is a continuation application of U.S. patent application Ser. No. 10/191,451, filed Jul. 10, 2002 now U.S. Pat. No. 6,917,544, all of which are hereby incorporated by reference.

FIELD OF THE INVENTION

This invention relates generally to devices including embedded nonvolatile memories.

BACKGROUND OF THE INVENTION

Nonvolatile memory cells are advantageous since they retain recorded information even when the power to the memory is turned off. There are several different types of non-volatile memories, including electrically programmable read only memories (EPROMs), electrically eraseable and programmable read only memories (EEPROMs) and flash EEPROM memories. EPROMs are electrically programmable, usually by channel hot electron injection into a floating gate, but are erasable through UV light exposure. Conventional EEPROMs have the same programming functionality, but instead of being light erasable they can be both erased and programmed electrically, for example, by electron tunneling into or out of the trapping media. Thus, information may be stored in these memories, retained when the power is off, and the memories may be erased for reprogramming, as necessary, using appropriate techniques. Flash EEPROMs have the same or similar read and programming functionality as EEPROMs. However, in contrast to EEPROMs where single bits, single bytes, or small amount of bytes may be selectively erased, in Flash EEPROMs, the erase is performed on a large number of bytes, typically referred to as a "sector" or a "block". As an example, an erase sector in a Flash EEPROM may be 1K Bytes, or 1M Bytes, or some other large number of Bytes. Thus, EEPROMS differ from Flash EEPROMs in the erase granularity.

In order to achieve the erase granularity, select transistors are used to isolate the bits to be erased from the other bits in the memory array. In Flash EEPROMs, this means that select transistors are required per each erase sector, i.e. per a large number of bits. On the other hand, in EEPROM devices, many more select transistors are required due to the finer erase granularity. As an example, for a true byte EEPROM device, one select transistor per cell may be required. Thus, for the same number of bits in an array, a Flash EEPROM array will usually be much smaller than a respective EEPROM array due to the much smaller overhead of select transistors. This makes Flash EEPROM devices more cost effective since the array area directly affects the total die size, Furthermore, the yield is also positively affected.

Nonvolatile memory cells differ in certain aspects from the transistors, typically called logic devices, that are generally utilized in electronic components, such as microcontrollers, that work with the memory cells, Logic devices are formed of transistors that use a single gate electrode while nonvolatile memories usually include two gate electrodes, known as the control and the floating gate electrodes, situated one over the other. Furthermore, the doping profiles of the source and drain junctions, and sometimes even the local substrate doping profile of logic and non-volatile memory transistors, differ. Because of these structural differences, nonvolatile memories and logic devices may be manufactured by some common and some different process steps. In addition, the non-volatile memory transistors used in Flash EEPROM and in EEPROM devices may differ as well, and in each case, the non-volatile cell structure is optimized for the specific application (Flash EEPROM vs. EEPROM) and the specific program and erase mechanisms being used. All these facts may contribute to a substantial increase in process complexity and manufacturing cost when integrating logic devices and non-volatile memory devices of one or more types onto the same die.

Conventionally, three approaches have been utilized to integrate FLASH and EEPROM onto a single integrated circuit die. One technique is to build both the EEPROM and FLASH devices using appropriate process technologies to create the two different types of devices on the same die. However, this results in a dramatic increase in the number of process steps involved and therefore greatly increases the cost of the resulting device. Therefore, such techniques have not met with considerable acceptance in the industry.

Alternatively, a basic FLASH memory may be created and an additional FLASH portion may be adapted to emulate EEPROM memory. The software may be stored in a boot block which may also be a FLASH memory. Thus, the system needs a first FLASH memory to act as FLASH, a second FLASH memory to store the software needed to emulate EEPROM operation and additional FLASH memory to actually implement the FLASH-like capabilities. This results in a very costly structure whose operation is complicated. Thus, this technique has also not met with considerable administrative acceptance.

The third technique is to use an EEPROM memory to emulate a FLASH memory. However, EEPROM memories are generally large and therefore tend to be much more expensive. In fact, EEPROM memories may be three to four times larger than FLASH memories. Therefore, this approach is generally not considered to be commercially viable and has similarly failed to meet with considerable commercial acceptance.

Exemplary combination flash and EEPROM devices are described in U.S. Pat. Nos. 6,252,799, 6,074,916 and 6,326,265.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1A:
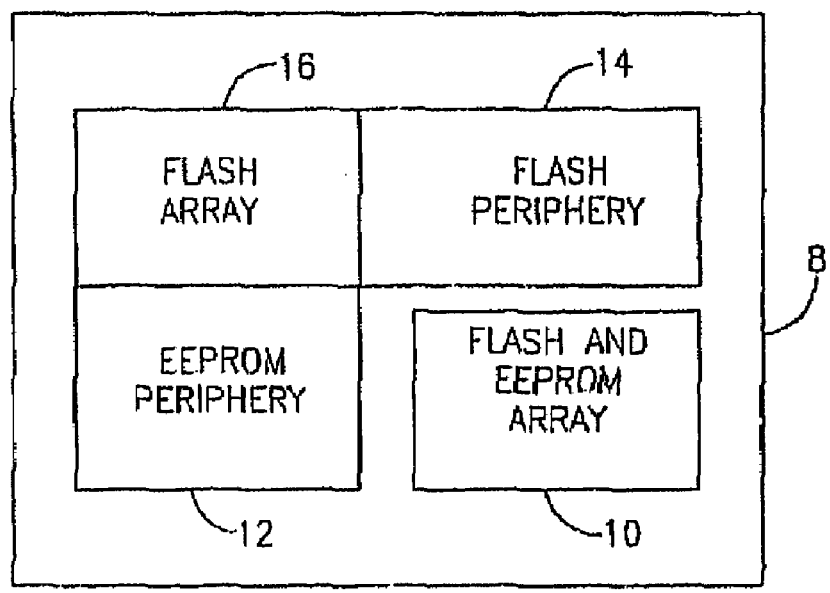
FIGS. 1A and 1B are schematic illustrations of multiple array dies.
Figure 1B:
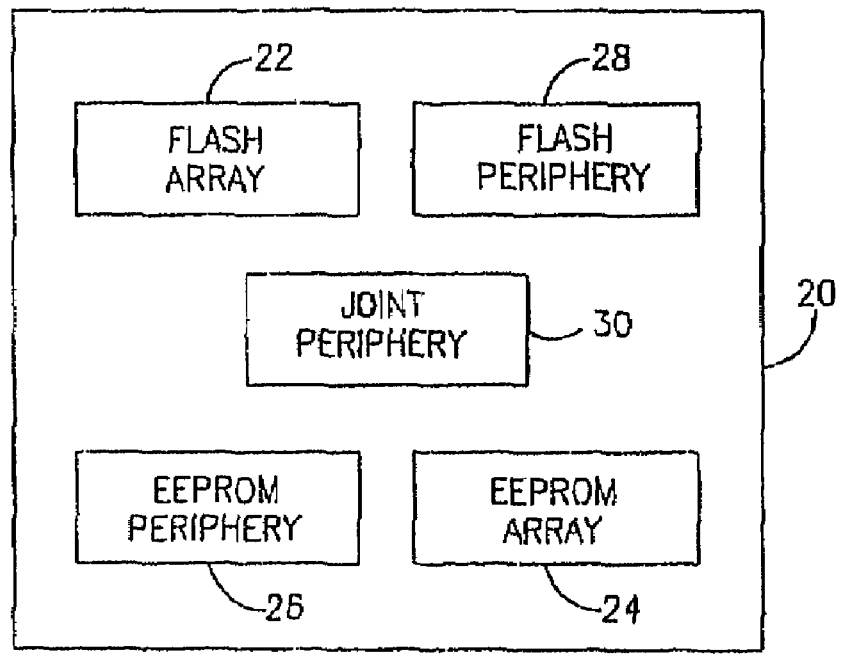

Reference is now made to FIGS. 1A and 1B, which illustrate two alternate embodiments of a single integrated circuit die, constructed and operative in accordance with the present invention. The present invention includes a die storing Flash and EEPROM bits. The bits may be stored together in the same array (as in FIG. 1A) or in separate sections of the die (as in FIG. 1B).

FIG. 1A shows a die 8 with a combined Flash and EEPROM array 10 and separate EEPROM and Flash peripheries 12 and 14, respectively. EEPROM periphery 12 may access and operate the EEPROM bits of array 10 while Flash periphery 14 may access and operate the Flash bits. Since some operations may be similar or the same for both EEPROM and Flash operation, there may exist a joint periphery 16 which may be used to access or to operate on both types of bits.

FIG. 1B shows a die 20 with separate arrays 22 and 24 for Flash bits and EEPROM bits, respectively. Similar to die 8 of FIG. 1A, there may be three kinds of peripheries: an EEPROM periphery 26, a Flash periphery 28 and a joint periphery 30. Charge pump circuits, used to generate voltages higher than the supply level, may be an example of peripheral circuits used to operate both the Flash and the EEPROM arrays. Sense amplifiers, used to read out the array data, may be another example of joint peripheral circuits. In general, the ability to use common circuits to operate both types of arrays depends also on the specifications of the device For example, if both arrays are allowed to be read at the same time, then the sense amplifiers can not be shared.

It will be appreciated that FIGS. 1A and 1B are exemplary in nature; the relative size and locations of the array(s) and peripheries will depend on the specific design and application of the chip. Furthermore, there may be more than one array of any type. Still further, the Flash bits may be block erased or page-mode erased, and similarly the EEPROM bits may be Byte or page erased.

One exemplary embodiment of the present invention may utilize nitride read only memory (NROM) cells, described in U.S. Pat. Nos. 5,768,192, 6,011,725 and Ser. No. 09/211,981, filed Dec. 14, 1998, assigned to the common assignee of the present invention. The disclosure of these patents and applications are incorporated herein by reference.

Figure 2A:
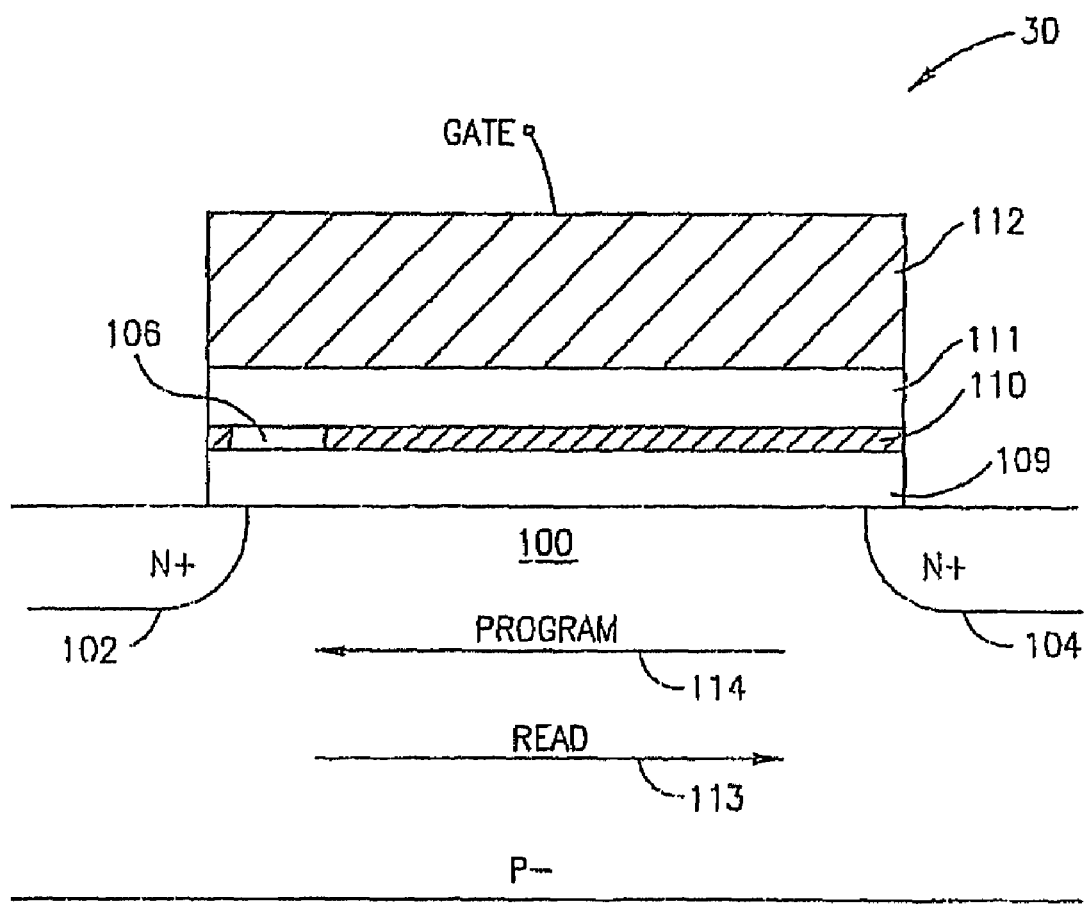
FIG. 2A is a schematic illustration of a single bit NROM cell.
Figure 2B:
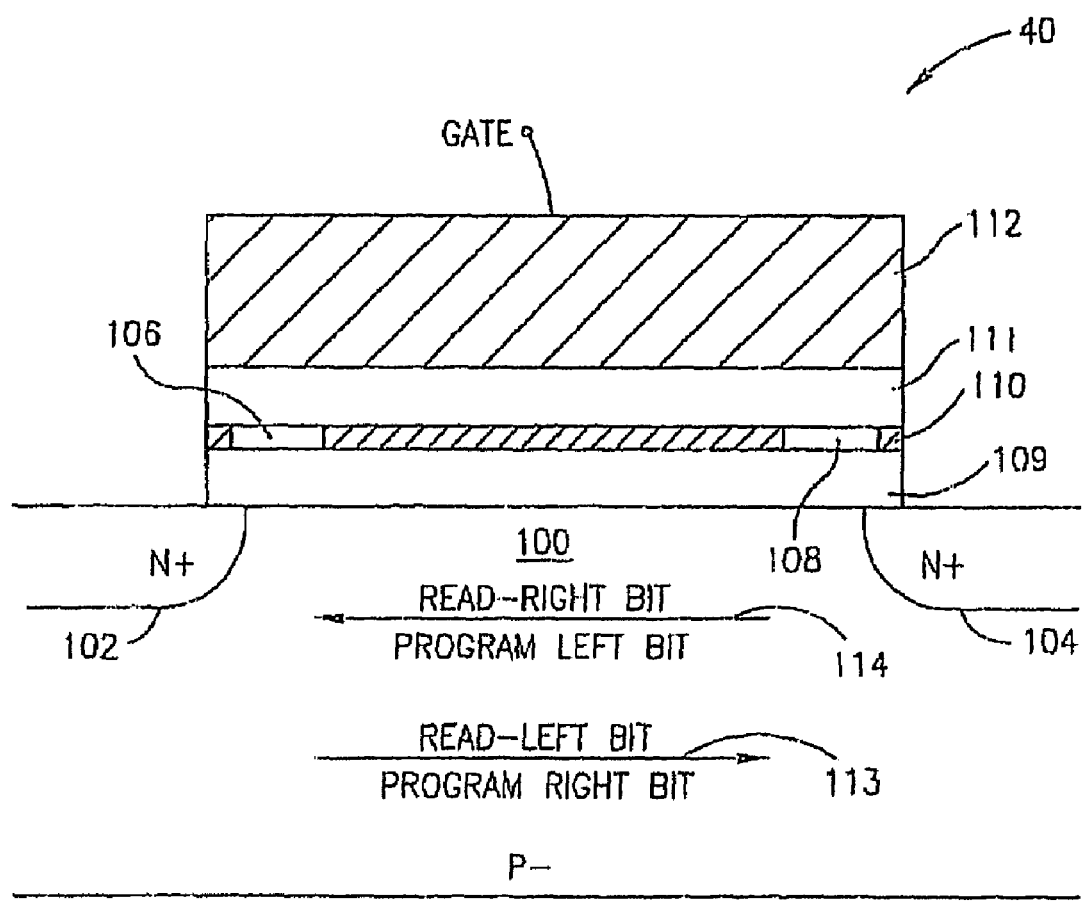
FIG. 2B is a schematic illustration of a dual bit NROM cell.

NROM cells, shown in FIGS. 2A and 2B to which reference is now made, may store data and may operate in arrays of either Flash or EEPROM types without any modification in the cell structure or in the operating mechanisms, as described hereinbelow. The NROM cell may have a channel 100 between two diffusion areas 102 and 104. Over the channel may be an oxide-nitride-oxide (ONO) sandwich (layers 109, 110 and 111), wherein each layer is 100 or less thick, over which lies a gate 112.

For a single bit cell 30 (FIG. 2A), charge may be stored in a charge storage area 106 of nitride layer 110 near one of the diffusion areas 102 or 104. For a dual bit cell 40 (FIG. 2B), there may be two separated and separately chargeable areas 106 and 108 within nitride layer 110, near each of diffusion areas 102 and 104.

Each chargeable area may define one bit or multiple bits. For the former, each bit may have only two distinct states, a '1' and a '0'. For the latter, each bit may have multiple states. For example, for two bits per storage area, the four states are '11', '00', '10' and '01'.

In the following discussion, the terms 'single bit' and 'dual bit' will be used to indicate storing charge in one or both of the charge storage areas 106 and 108, irrespective of the number of threshold voltage levels defined for the storage area.

The single and dual bit cells 30 and 40 may be operated similarly, where the operations which occur to access the bit in charge area 106 in single bit cell 30 may also occur to access the bit in charge area 106 in dual bit cell 40. Therefore, the presentation below will describe the dual bit operation, it being understood that the single bit operation may be similar but operative only on one of the bits, such as left bit 106.

To program the left bit in area 106, gate 112 may receive a high programming voltage $V_g$, left diffusion area 102 may act as the drain and may receive a drain programming voltage VD and right diffusion area 104 may be grounded (i.e. area 104 acts as the source). Hence the electrons may flow from area 104 to area 102 (as indicated by arrow 114). The channel hot electrons may then be injected into the nitride layer, in area 106. The negative charge in area 106 may raise the threshold voltage of the cell, if read in the reverse direction.

The opposite is true for programming area 108 (for dual bit cell 40 only); the left diffusion area 102 may be the source (i.e. grounded) and right diffusion area 104 may be the drain (i.e. receives the drain programming voltage VD). The cell may therefore be programmed in the opposite direction (as indicated by arrow 113 (FIG. 2B)), and the electrons may then jump up into chargeable area 108.

For NROM cells (single and dual), a bit may be read in the direction opposite (a "reverse read") to that of its programming direction. An explanation of the reverse read process is described in U.S. Pat. No. 6,011,725, mentioned above. Thus, to read the left bit stored in area 106, right diffusion area 104 may be the drain and left diffusion area 102 may be the source. This is known as the "read through" direction (indicated by arrow 113). To read the right bit stored in area 108 of dual bit cell 40, the cell may be read in the opposite direction (as indicated by arrow 114). Thus, left diffusion area 102 may be the drain and right diffusion area 104 may be the source.

To erase the left bit in area 106, the gate may receive a negative erase gate voltage Vge, the left diffusion area 102 may receive an erase voltage $V_e$ and right diffusion area 104 may be left floating. To erase the right bit in area 104, the gate may receive negative erase gate voltage Vge, the right diffusion area 104 may receive erase voltage Ve and left diffusion area 102 may be left floating.

Applicants have realized that, unlike for floating gate devices, the difference between an NROM EEPROM and an NROM flash device may not be in the structure of the cell nor much in the architecture of the array (particularly, there is no need for per cell select transistors as in floating gate EEPROM devices), but in the access operations (i.e. read, write and erase). Thus, the NROM cell may be particularly suitable for multiple use chips.

Figure 3:
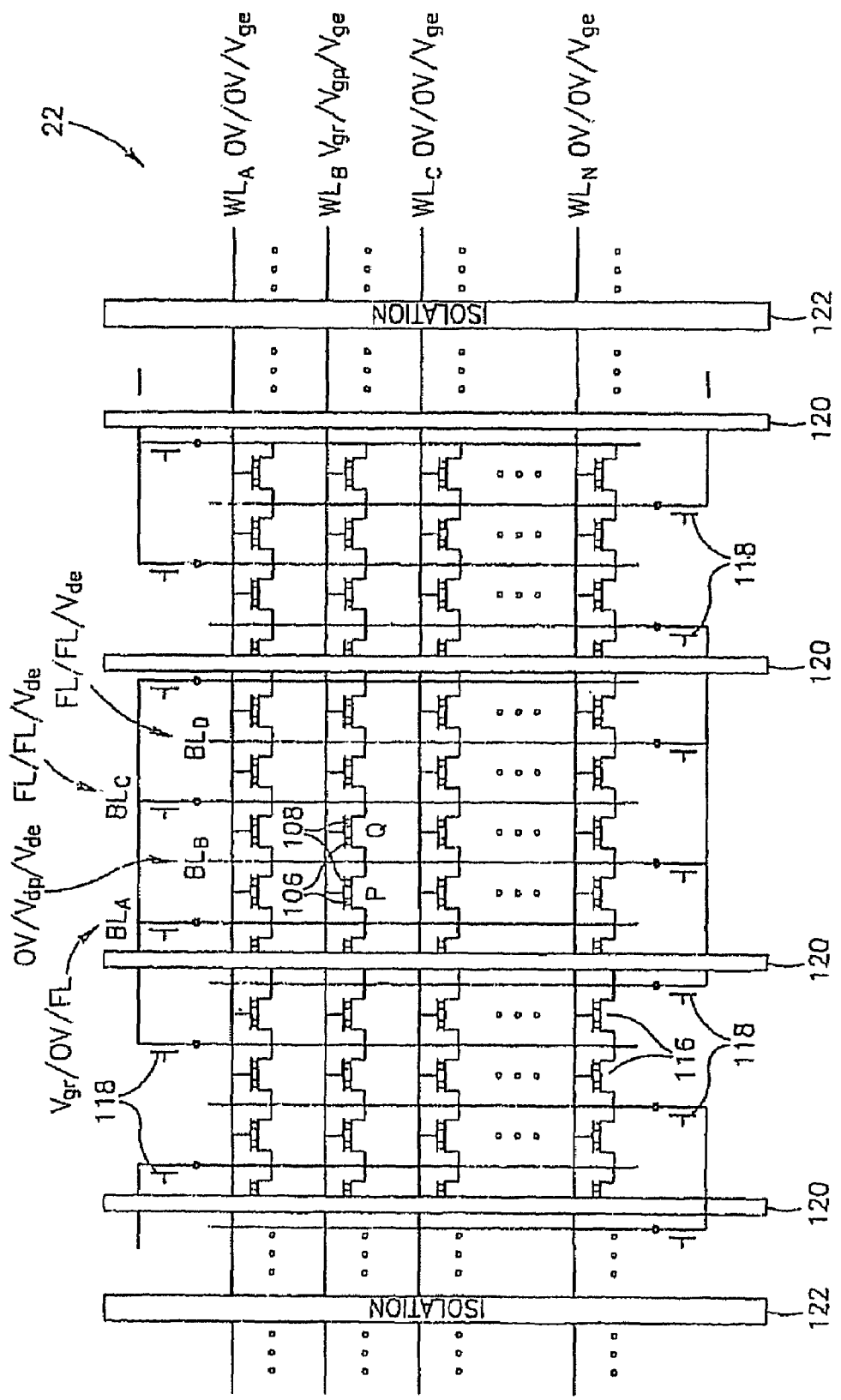
FIG. 3 is a schematic illustration of an exemplary embodiment of a flash array and its programming and erase operations when implemented with NROM memory cells.

Reference is now made to FIG. 3, which illustrates an exemplary embodiment of independent flash array 22 and its programming and erase operations when implemented with NROM memory cells.

In this example, the array may be a virtual ground array in which cells 116 are formed into a matrix. An exemplary architecture for such an array may be described in U.S. Ser. No. 09/727,781, filed Dec. 4, 2000, assigned to the common assignee of the present invention, whose disclosure is incorporated herein by reference. Alternative architectures are also incorporated in the present invention.

Flash array 22 may be segmented by select transistors 118 to implement blocks (sometimes also referred as "sectors" or "erase sectors"). Select transistors 118 may connect metal lines 120 to bit lines BL of a block.

The Flash array 22 may be further segmented by isolation zones 120 into isolated virtual ground slices. The isolation zones 122 may be necessary to prevent interaction of two bits on the same WL that are accessed at the same time Isolation zones 122 may be manufactured as a thick oxide region, as a shallow trech isolation, as an unused column of memory cells or with any other suitable isolation technique.

As a Flash array, the bits of flash array 22 may be individually read and programmed while blocks of the array may be erased together. In FIG. 3, two exemplary cells P and Q are noted. The gates of cells 116 of a row may be connected to a word line WL, such as WLA, and the diffusions of two columns of neighboring cells 116 may be connected together as a bit line BL, such as BLB. For example, the right diffusion of cell P and the left diffusion of cell Q are connected to bit line BLB while their gates are connected to word line WLB.

It is noted that the voltage levels to be provided to the word and bitlines during the read/program/erase operations may be listed on the figures in that order. Thus, the label Vr/0/F may indicate that the line may receive a read voltage Vr during reading, a 0 (or ground) voltage during programming and may be left floating (F), or driven to a low voltage, during erasure.

To read the right-side bit 108 of memory cell P, a reading gate voltage Vgr (typically in the range of 2-5V, e.g. 3V) may be applied to word line WLB, a read source voltage Vsr (typically in the range of approximately 1-2V, e.g. 1.5V) may be applied to bit line BLA, and bit line BLB may be grounded (OV). All other bit lines may preferably be floated (FL) near ground prior to any operation (reading, programming or erasing). All other word lines may be grounded.

If it is desired to program right-side bit 108 of memory cell P, a programming gate voltage Vgp (typically in the range of approximately 7-10V, e.g., 9V) may be applied to word line WLB, a programming drain voltage Vdp (typically in the range of approximately 3-6V, e.g. 4.5V) may be applied to bit line BLB, and bit line BLA may be grounded (0V) All other bit lines may preferably be floated (FL) near ground prior to any operation (programming or erasing). All other word lines may be grounded For erasing, a block of flash cells are erased together, typically by erasing a column, some columns, or all columns of bits at a time. For each column, a negative erase gate voltage Vge (such as approximately in the range of –2 to –7V) may be applied to all word lines WL and a positive erase drain voltage Vde (typically in the range of approximately 3-6V, e.g. 4V) may be applied to the bit line whose bits need to be erased. For example, bit lines BLB and BLD may receive the positive erase drain voltage Vde. The other bit lines of the array may be floating.

The bits on both sides of bit line BLB may be erased since both bits receive the exact same gate and bit line voltages. Thus, left-side bit 106 of cell Q may also be erased together with right-side bit 108 of cell P and similarly for the other bits along bit line BLB. By changing which bit lines BLs receive the drain voltage Vd, different columns of bits in array 22 may be erased. The considerations of how many bit lines may be erased together include erase time, erase characteristics, and erase currents.

Figure 4:
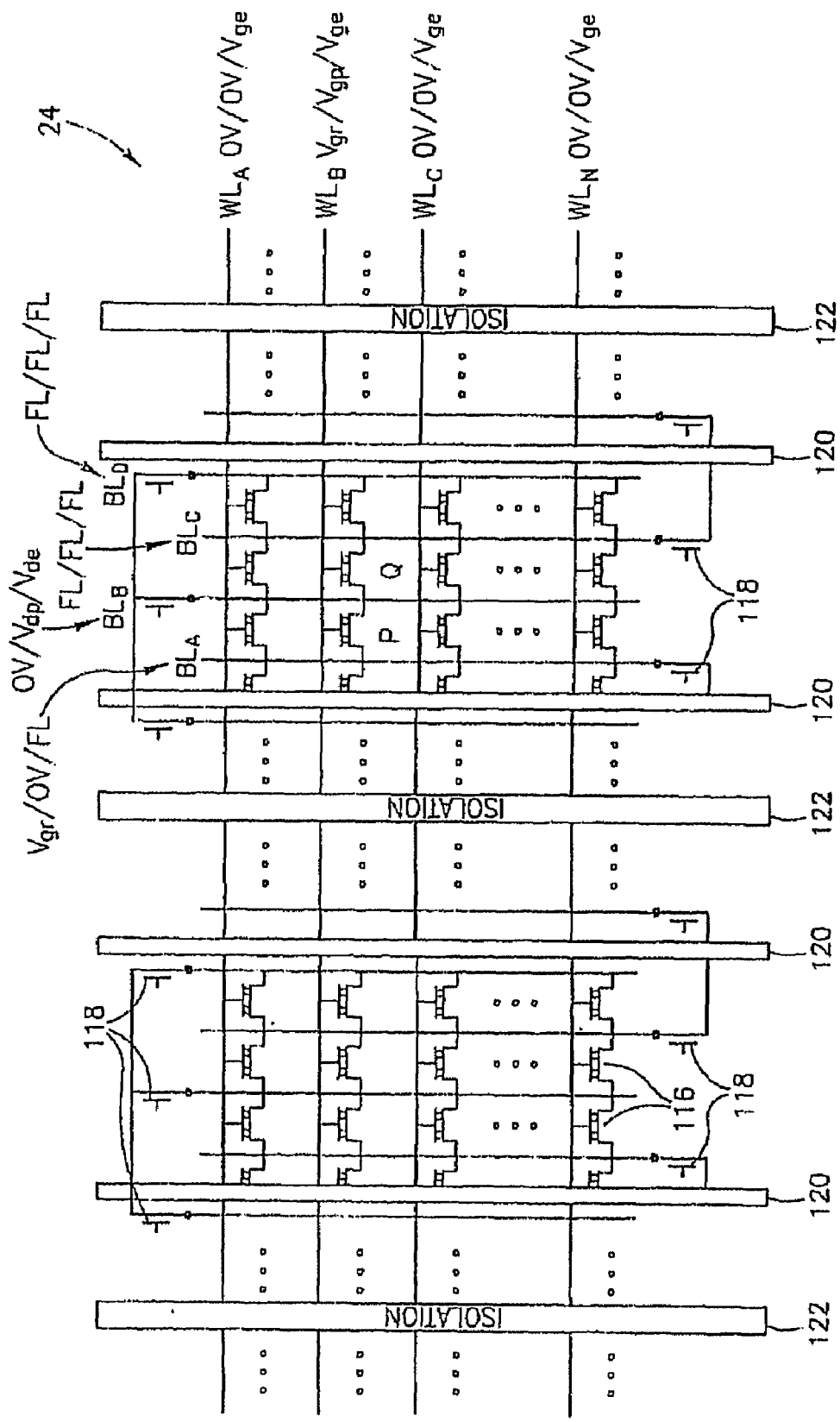
FIG. 4 is a schematic illustration of an exemplary EEPROM array and its programming and erase operations, when implemented with NROM memory cells.

Reference is now made to FIG. 4, which illustrates an exemplary embodiment of independent EEPROM array 24 and its programming and erase operations, when implemented with NROM memory cells. Such an exemplary array may be described in U.S. Ser. No. 09/761,818, filed Jan. 18, 2001 and Ser. No. 09/841,052, filed Apr. 25, 2001, assigned to the common assignee of the present invention, whose disclosure is incorporated herein by reference.

EEPROM array 24 may be implemented in blocks or not. The considerations for EEPROM array segmentation include operation performance and characteristics, disturbs, etc., as can be understood by those skilled in the art. The bits of EEPROM array 24 may be individually read, programmed and erased using the relevant read, program and erase voltages In this example, EEPROM array 24 may be similar to flash array 22 of FIG. 3, with the addition of extra isolation zones 122 which define therebetween a slice of word lines and bit lines. Isolation zones 122 may serve to stop voltage propagation which may occur during programming and erasure and which may cause partial erasure of non-accessed cells. Depending on the array design and voltages used, the isolation zones 122 may divide the array into slices of a plurality of columns or of just one column.

If it is desired to program right-side bit 108 of memory cell P, a programming gate voltage Vgp (typically in the range of approximately 7-10V, e.g., 9V) may be applied to word line WLB, a programming drain voltage Vdp (typically in the range of approximately 3-6V, e.g. 4.5V) may be applied to bit line BLB, and bit line BLA may be grounded (0V). All other bit lines may preferably be floated (FL) near ground prior to any operation (programming or erasing). All other word lines are either grounded or receive a programming inhibit voltage Vip, as described in U.S. Ser. No. 09/761,818, which may inhibit the undesired partial erasure of non-accessed cells which may occur during programming and erasing of an accessed cell. For example, the programming inhibit voltage Vip may be 1V, although other inhibit voltages may be appropriate, as described in U.S. Ser. No. 09/761,818.

If it is desired to erase right-side bit 108 of memory cell P, a negative erase gate voltage Vge (such as approximately in the range of –2V to –7V) may be applied to word line WLB, a positive erase drain voltage Vde (typically in the range of approximately 3-5V, e.g. 4V) may be applied to bit line BLB, and the remaining bit lines are floated near ground before erasing. All other word lines receive an erase inhibit voltage Vie, as described in U.S. Ser. No. 09/761,818. For example, erase inhibit voltage Vie may be 3V, although other inhibit voltages may be appropriate, as described in U.S. Ser. No. 09/761,818.

It is noted that left-side bit 106 of cell Q may receive the same gate, drain and source voltages. This means that left-side bit 106 of cell Q may also be erased together with right-side bit 108 of cell P. Accordingly, after an erasure of right-side bit 108 of cell P, left-side bit 106 of cell Q may be re-programmed to its original value. This is the case for a two-bit NROM cell. For single bit operation, it is preferable to arrange the bits so that they do not share a common bit line. In such an arrangement, no neighboring bit would be erased upon erasure of right-side bit 108 of cell P, for example.

It is noted that EEPROM array 24 is not an emulated array as in the prior art but a proper EEPROM array. Each bit of the array is erasable directly and there is no need to copy the contents of a block to another storage area, modify them, erase the whole block and then rewrite the modified stored contents back into the array. Furthermore, it is also noted that the NROM based EEPROM array does not require a select transistor per cell as encountered in EEPROM arrays based on floating gate devices.

As can be seen from the above, the array architectures of NROM based EEPROM array 24 and Flash array 22 may be identical or very similar. If desired, both arrays 22 and 24 may be implemented in slices. Alternatively, only EEPROM array 24 may be implemented in slices. A slice may be at least one column of NROM cells wide and the slices of the arrays may be of unequal widths.

Moreover, the operations of the two arrays may also be very similar with the exception of the voltage levels that may vary between EEPROM and Flash operations in order to obtain different program and erase performance and characteristics. Also, the access to the arrays may differ in order to achieve the individual vs. group erasure. Since the NROM cell in the Flash and EEPROM arrays may be the same, and due to the identical or similar array architectures, the same array may be operated in either Flash or EEPROM modes.

Since the EEPROM cell and flash cell may be identical in structure, the manufacturing processes to produce flash array 22 and EEPROM array 24 (of FIG. 1B) may be identical or, at least, very similar. Moreover, the process to manufacture combined array 10 (FIG. 1A) may also be the same. An exemplary manufacturing process that may be used to manufacture both flash array 22 and EEPROM array 24 is described in U.S. Pat. No. 6,297,096, assigned to the common assignee of the present invention, whose disclosure is incorporated herein by reference.

Figure 5A:
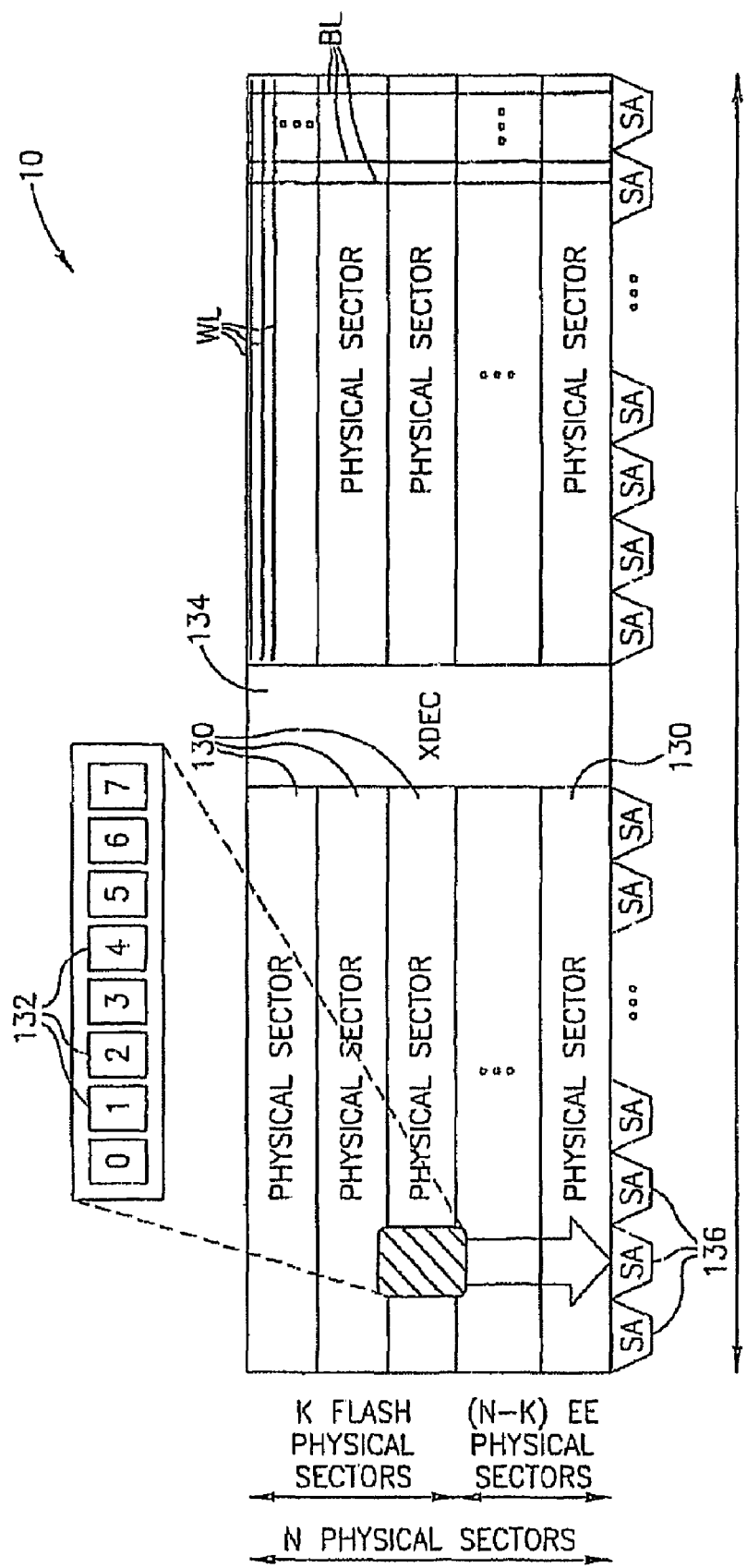
FIGS. 5A, 5B and 5C are schematic illustrations of multiple use arrays within a virtual ground array.

Reference is now made to FIG. 5A, which illustrates an exemplary multiple use array 10 which may contain multiple physical sectors 130, where each physical sector 130 may contain isolated virtual ground slices 132. The physical sectors 130 may be accessed by a single row decoder 134 and the data may be read with a sense amplifier 136, one per set of isolated slices 132. In FIG. 5A, there are 8 isolated slices 132 per sense amplifier 136.

In FIG. 5A, each physical sector 130 may operate as a Flash or as an EEPROM type of array. The functionality of each physical sector 130 may be predetermined, e.g. by a predetermined address mapping, or may be configurable. For example, the configuration may be performed through the decoding of the word line addresses.

In FIG. 5A, there are N physical sectors 130 of which K are Flash physical sectors and N-K are EEPROM physical sectors. K may be a predetermined number or a configurable number. If K is a configurable number, then additional peripheral circuits may need to be configured accordingly, e.g. the decoding circuitry, the address mapping generator, etc.

Each physical sector 130 may comprise multiple word lines WL while the global bit lines GBL may extend through multiple physical sectors 130 to the appropriate sense amplifier 136. Thus, each sense amplifier 136 may read data from Flash and EEPROM cells, depending on which word line, one part of a Flash or one part of an EEPROM physical sector, may be activated.

Figure 5B:
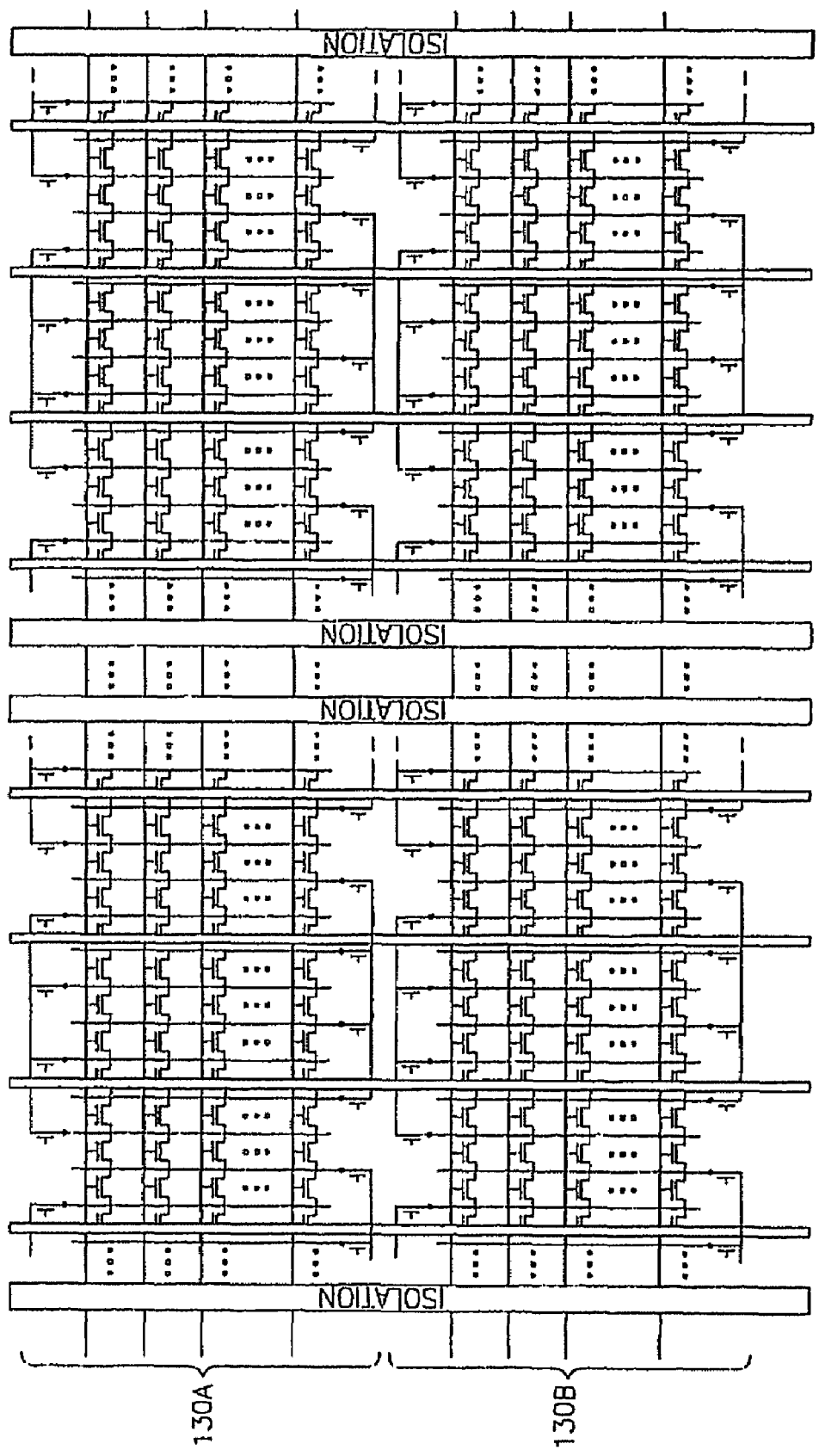
Figure 5C:
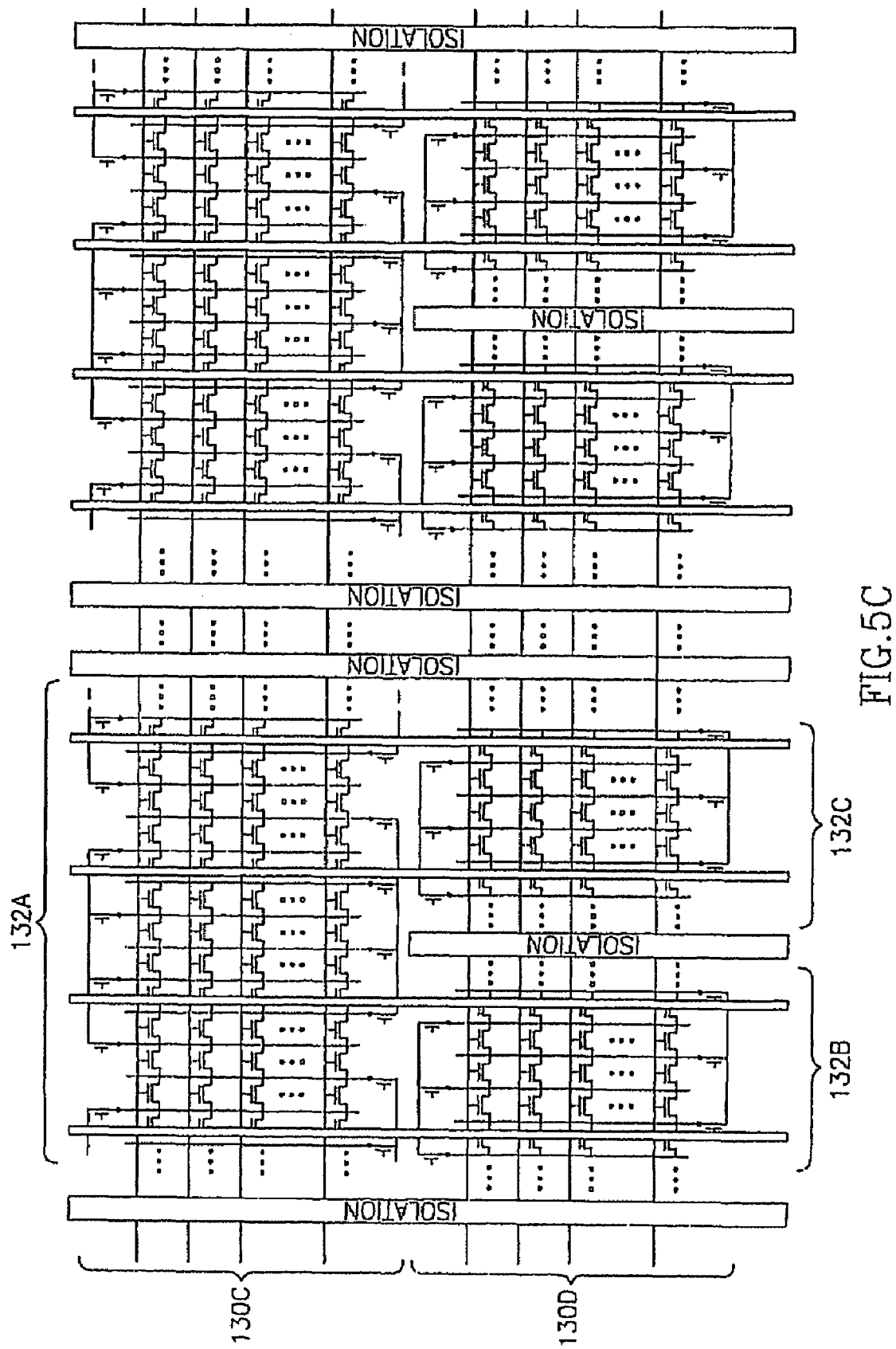

Reference is now made to FIGS. 5B and 5C, which illustrate two embodiments of the array of FIG. 5A, using the array architecture of FIGS. 3 and 4.

FIG. 5B shows two physical sectors 130A and 130B, where physical sector 130A may be a Flash physical sector, with X word lines WL, and physical sector 130B may be an EEPROM physical sector, with Y word lines WL. The two types of physical sectors may be generally identical with the only difference being their mode of operation.

FIG. 5C also shows two physical sectors, here labeled 130C and 130D, where physical sector 130C may be a Flash physical sector, with X word lines WL, and physical sector 130D may be an EEPROM physical sector, with Y word lines WL. However, in this embodiment, the widths of the two types of slices 132 may be different. For example, Flash isolated slice 132A has Q NROM cells while EEPROM isolated slices 132B and 132C have P NROM cells.

It is also contemplated that different isolated virtual ground slices within a physical sector may operate as Flash or EEPROM. In this case the pre-determined or configurable functionality of each slice is controlled also by the BL decoder addresses.

The present invention is not only applicable for virtual ground arrays and the partitioning of the arrays into Flash and EEPROM functionalities is not necessarily on a per block, per sector or per slice basis. As a different example of a multiple use die 8 (FIG. 1A), array 10 may be a combined NROM based NOR Flash and EEPROM array. Such an array is described in U.S. Ser. No. 10/023,469, filed Dec. 20, 2001, assigned to the common assignee of the present invention, whose disclosure is incorporated herein by reference.

Figure 6:
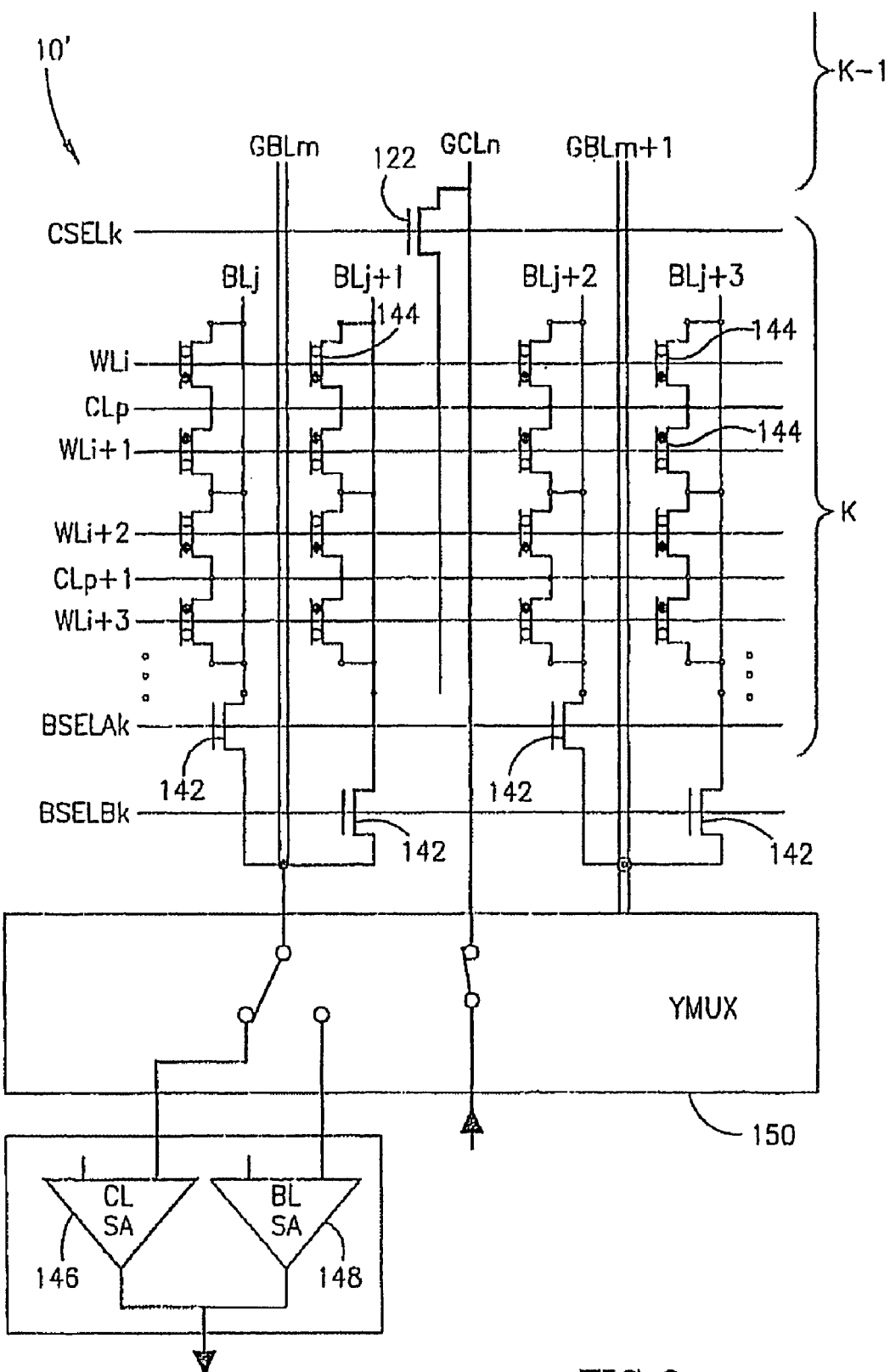
FIG. 6 is a schematic illustration of a multiple use array within a NOR array.

In this array, shown in FIG. 6 to which reference is now made and labeled 10' therein, the architecture may be that of a NOR array, with one bit line BLj per column and a common line CLj per one or more word lines. Nor array 10' may be segmented by common line select transistors 140 and bit line select transistors 142 to implement blocks and to connect metal lines to bit lines BL and common lines CL of a block. It will be appreciated that the segmentation may be not required to practice the present invention, nor may the particular segmentation shown in FIG. 6 be the only segmentation possible.

Each NROM cell 144 may be connected between one bit line BLj and one column line CLj. In this embodiment, each cell may have two storage areas, a Flash storage area and an EEPROM storage area. The Flash storage area, shown as a solid circle, may be the bit on the side of the cell connected to the common line CLj while the EEPROM storage area, shown as an open circle, may be on the side of the cell connected to the bit line BLj. In other words, a group of the Flash storage areas 144 (such as those connected to a common line or all of the storage areas of a block) may be erased together while the EEPROM storage areas 142 may be individually erasable. A YMUX 150 may include switching elements to connect the relevant power supplies to the relevant bit line BL and/or common lines CL.

The voltages used for reading, programming and erasing may be those described above with respect to FIGS. 3 and 4, where those for FIG. 3 may be appropriate for the Flash storage area and those for FIG. 4 may be appropriate for the EEPROM storage area.

In reading, the terminal close to the storage area being read may be grounded. Each type of bit may be read differently. The Flash storage area may be read with a CL sense amplifier 146, which may perform a close to ground sensing, while the EEPROM storage area may be read with a BL sense amplifier 148, which may perform a standard, precharge sensing. More details about implementing close to ground reading can be found in U.S. Pat. No. 6,128,226, whose disclosure is incorporated herein by reference. YMUX 150 may connect the relevant sense amplifier to be line BL depending on which type of bit is to be read at a given time.

During programming or erasing, the terminal close to the storage area being programmed or erased may be at programming or erasing voltages Vdp or Vde.

Finally, all of the Flash storage areas of a block may be erased together. To do so, the common lines CL of the block may be driven to the erase voltage Ve, all of the bit lines BL of the block may be set to float and the word lines WL of the block may be driven to their erase voltage. For example, a −7V erase voltage can be used. Positive erase voltages can be utilized as well.

In an alternative embodiment of the present invention, the NOR array may be utilized for multiple die 20 (FIG. 1B). For flash array 22, the NROM cells may be utilized as single or as dual bit cells, where the bits may be flash bits. The storage areas connected to one common line may be erased together and the storage areas connected to one bit line may be erased together.

For EEPROM array 24, the NROM cells may be single bit cells which may use the EEPROM storage areas (i.e. those connected to bit lines BLj). The bits stored therein may be EEPROM bits that are accessed as described hereinabove.

Figure 7:
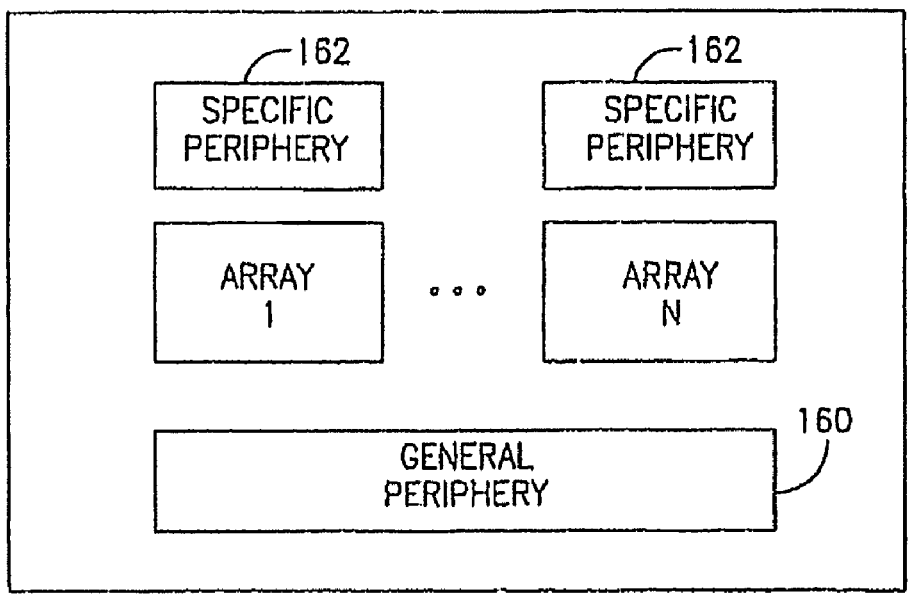
FIGS. 7 and 7A are schematic illustrations of dies with multiple arrays thereon of different types.
Figure 7A:
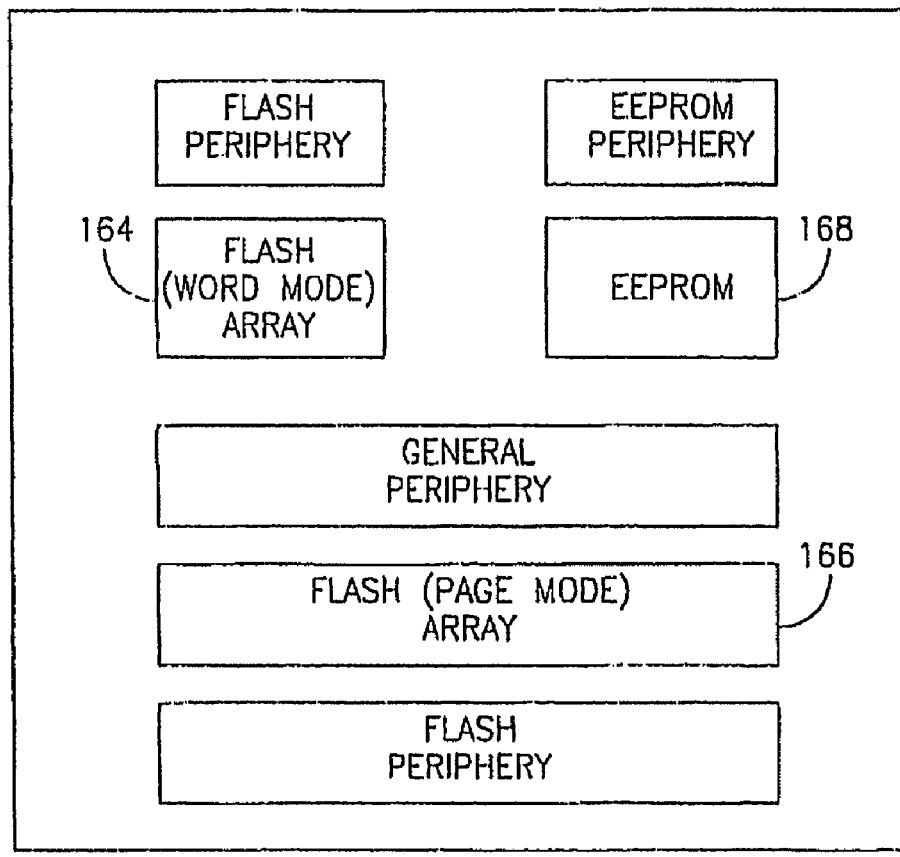

Reference is now made to FIGS. 7 and 7A, which illustrate a multiple use die with more than one array of at least one type. The general case may be shown in FIG. 7 which a specific case may be shown in FIG. 7A In general, the present invention may be used for N arrays on a single die, where some of the N arrays may be Flash type arrays and some of the arrays may be EEPROM type arrays. There may be a general periphery 160 and specific peripheries 162 for the arrays, where the general periphery 160 provides circuits that can be used by more than array.

FIG. 7A shows one embodiment with two Flash arrays 164 and 166 and one EEPROM array 168. Flash array 164 may be a word mode array, in which words of a fixed length may be erased at a time, useful for storing program code which changes rarely and may be read and programmed in small chunks but erased in large chunks Flash array 164 may have a fast access time Flash array 166 may be a page mode array, in which entire pages or blocks may be erased at a time, useful for storing large amounts of data, such as a video sequence. Such an array may have long first byte latency and fast burst access. EEPROM array 168 may have individual byte or word erasure, useful for storing small chunks of data that may be frequently modified (e.g. phone numbers on a cellular telephone).

The methods and apparatus disclosed herein have been described without reference to specific hardware or software. Rather, the methods and apparatus have been described in a manner sufficient to enable persons of ordinary skill in the art to readily adapt commercially available hardware and software as may be needed to reduce any of the embodiments of the present invention to practice without undue experimentation and using conventional techniques.

It will be appreciated by persons skilled in the art that the present invention is not limited by what has been particularly shown and described hereinabove. Rather the scope of the invention is defined by the claims that follow:

What is claimed is:

1. A non-volatile memory ("NVM") die comprising:
   a first set of NVM cells adapted to be operated as a first type of flash memory;
   a second set of NVM cells adapted to be operated as a second type of flash memory; and
   wherein cells within said first set of cells and cells within said second set of cells are of substantially similar structure.

2. The die according to claim 1, wherein at least one of said sets is adapted to be operated as NAND type flash memory.

3. The die according to claim 1, wherein at least one of said sets is adapted to be operated as NOR type flash memory.

4. The die according to claim 1, wherein at least one set of cells is adapted to be operated as code flash.

5. The die according to claim 1, wherein at least one set of cells is adapted to be operated as data flash.

6. The die according to claim 1, wherein at least one set of cells comprises at least one multi-bit-per-cell cell.

7. The die according to claim 6, wherein said multi-bit-per-cell cell is adapted to store the multiple bits of data in separated physical locations.

8. The die according to claim 6, wherein said multi-bit-per-cell cell is adapted to store the multiple bits of data in the same physical locations.

9. The die according to claim 1, wherein at least one set of cells comprises both single-bit-per-cell and multi-bit-per-cell cells.

10. The die according to claim 1, wherein at least one set of cells is adapted to be operated as multi-bit-per-cell cells.

11. The die according to claim 1, wherein at least one set of cells is adapted to be operated as single-bit-per-cell cells.

12. The die according to claim 1, wherein at least one set of cells is adapted to be operated as multi-bit-per-cell cells, and wherein at least one cell from the at least one set of cells is adapted to store data in multi level mode.

13. The die according to claim 1, wherein at least one set of cells is adapted to be operated as multi-bit-per-cell cells, and wherein at least one cell of the at least one set of cells is adapted to store data in single level mode.

14. A non-volatile memory ("NVM") device comprising:
    a first set of NVM cells; and
    a second set of NVM cells having substantially similar structure to cells in said first set of NVM cells; and
    a controller adapted to operate said first set of cells as a first type of flash memory and to operate said second set of cells as a second type of flash memory.

15. The device according to claim 14, wherein said controller is adapted to operate at least one of said sets of cells as NAND memory.

16. The device according to claim 14, wherein said controller is adapted to operate at least one of said sets of cells as NOR memory.

17. The device according to claim 14, wherein said controller is adapted to operate at least one set of cells as code flash.

18. The device according to claim 14, wherein said controller is adapted to operate at least one set of cells as data flash.

19. The device according to claim 14, wherein at least one set of cells comprises at least one multi-bit-per-cell cell.

20. The device according to claim 19, wherein said multi-bit-per-cell cell is adapted to store multiple bits of data in separated physical locations.

21. The device according to claim 19, wherein said multi-bit-per-cell cell is adapted to store multiple bits of data in the same physical locations.

22. The device according to claim 14, wherein at least one set of cells comprises both single-bit-per-cell and multi-bit-per-cell cells.

* * * * *